(12) United States Patent
Heinrich et al.

(10) Patent No.: US 8,504,892 B2
(45) Date of Patent: Aug. 6, 2013

(54) LDPC DECODER AND METHOD FOR LDPC DECODING BASED ON LAYERED ALGORITHM APPLIED TO PARITY CHECK MATRIX

(75) Inventors: Vincent Heinrich, Izeaux (FR); Laurent Paumier, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 532 days.

(21) Appl. No.: 12/760,672

(22) Filed: Apr. 15, 2010

(65) Prior Publication Data

US 2010/0269020 A1   Oct. 21, 2010

(30) Foreign Application Priority Data

Apr. 16, 2009 (FR) ...................................... 09 52504

(51) Int. Cl.
*G06F 11/00*         (2006.01)
(52) U.S. Cl.
USPC .......................................................... 714/758
(58) Field of Classification Search
None
See application file for complete search history.

(56) References Cited

U.S. PATENT DOCUMENTS

| | | | |
|---|---|---|---|
| 8,037,388 B2 * | 10/2011 | Heinrich et al. | 714/752 |
| 2008/0049869 A1 * | 2/2008 | Heinrich et al. | 375/298 |
| 2008/0074300 A1 * | 3/2008 | Cherubini | 341/120 |
| 2008/0197982 A1 * | 8/2008 | Sadr | 340/10.4 |
| 2008/0270868 A1 | 10/2008 | Shinagawa et al. | |
| 2011/0096858 A1 * | 4/2011 | Klimer | 375/267 |

FOREIGN PATENT DOCUMENTS

WO   WO 2009004572 A   1/2009

OTHER PUBLICATIONS

French Search Report dated Nov. 12, 2009 from corresponding French Application No. 09/52504.
Predrab, R. et al., *Multi-Rate High-Throughput LDPC Decoder: Tradeoff Anaylis Between Decoding Throughput and Area, Personal, Indoor and Mobile Radio Communications*, 2006 IEEE, PI Sep. 1, 2006, pp. 1-5 XP031023692.
Rovini et al., *Layered Decoding of Non-Layered LDPC Codes 9th Euromicro Conference on Digital System Design: Architectures, Methods and Tools (DSD'06)*, IEEE, 2006, pp. 537-544, XP031001370.
Yang, S, et al., *A Low-Power 1-Gbps Reconfigurable LDPC Decoder Design for Multiple 4G Wireless Standards*, SOC Conference, 2008 IEEE International, IEEE Piscagtaway, NJ, USA, Sep. 17, 2008, pp. 367-370, XP031345880.

* cited by examiner

*Primary Examiner* — Christopher McCarthy
(74) *Attorney, Agent, or Firm* — Wolf, Greenfield & Sacks, P.C.

(57) ABSTRACT

A low density parity check decoder for performing LDPC decoding based on a layered algorithm applied to a parity check matrix, the decoder including a channel memory, a metrics memory, first and second operand supply paths each arranged to provide operands based on channel values and metrics values; a processor block including a plurality processing units in parallel and arranged to receive operands from the first supply path and to determine updated metric values, a buffer arranged to store at least one of the operands from the first supply path; and an adder coupled to an output of the processor block and arranged to generate updated channel values by adding the updated metrics values to operands from a selected one of the buffer and the second supply path.

22 Claims, 5 Drawing Sheets

LDPC DECODER AND METHOD FOR LDPC DECODING BASED ON LAYERED ALGORITHM APPLIED TO PARITY CHECK MATRIX

CROSS REFERENCE TO RELATED APPLICATIONS

This application claims the priority benefit of French patent application Ser. No. 09/52504, filed on Apr. 16, 2009 entitled "LDPC DECODER," which is hereby incorporated by reference to the maximum extent allowable by law.

BACKGROUND OF THE INVENTION

1. Field of the Invention

The present invention relates to a low density parity check (LDPC) decoder and method for performing LDPC decoding, and in particular to an LDPC decoder and method using a layered belief propagation (LBP) algorithm.

2. Background to the Invention

Forward error correction (FEC) codes add redundancy to data packets to be transmitted over a transmission channel, such that errors introduced by noise in the transmission channel can be corrected by the receive circuitry.

LDPC codes are a type of forward error correction code, and are block based, encoding and decoding being performed based on a parity check matrix. The matrix is sparse, meaning that it comprises a low number of "1"s compared to "0"s, which is why such codes are referred to as low density codes.

At the transmitter side, blocks of N bits of data are transmitted, K bits of which correspond to information, and N-K bits of which correspond to redundancy added to the data. The parity check matrix comprises N-K rows and N columns.

At the receiver side, for decoding LDPC codes, log-likelihood ratio (LLR) values of the sets of symbols received by the receive circuitry are determined and provided as inputs to the LDPC decoder.

One LDPC decoding technique involves an iterative updating of the initial LLR values based on the parity check matrix H, performed row by row and then column by column. A faster technique has been proposed that uses an algorithm known as layered belief propagation (layered BP), according to which the H matrix is divided into layers, each layer comprising n rows of the matrix H. Furthermore, each layer is divided column-wise into sub-matrices, for example each comprising n by n values. Decoding is performed layer by layer based on the non-null sub-matrices in each layer, and the updated LLR values are directly used for processing the following layer, leading to a faster convergence of the algorithm.

LDPC decoders based on the layered BP algorithm generally use a memory to store the iteratively updated LLR values. Furthermore, to speed-up the throughput of the decoder, pipelined architectures have been proposed. However, due to the number of memory accesses required for retrieving LLR values, existing solutions tend to be far from optimal. There is thus a need for an improved LDPC decoder architecture.

SUMMARY OF THE INVENTION

It is an aim of embodiments of the present invention to at least partially address one or more needs in the prior art.

According to one aspect of the present invention, there is provided a low density parity check (LDPC) decoder for performing LDPC decoding based on a layered algorithm applied to a parity check matrix, the decoder comprising a channel memory arranged to store channel values initially corresponding to log-likelihood ratios of symbols received via a transmission channel; a metrics memory arranged to store metrics values; first and second operand supply paths each arranged to provide operands based on the channel values and the metrics values; a processor block comprising a plurality processing units in parallel and arranged to receive operands from said first supply path and to determine updated metric values based on said operands; a buffer arranged to store at least one of said operands from said first supply path; and an adder coupled to an output of the processor block and arranged to generate updated channel values by adding said updated metrics values to operands from a selected one of said buffer and said second supply path.

According to one embodiment, the first supply path comprises a first subtractor block having a first input coupled to a selected one of the channel memory and the output of the adder and a second input coupled to a first output of the metrics memory.

According to another embodiment, the first supply path comprises a first multiplexer having a first input coupled to an output of the channel memory and a second input coupled to the output of a pipeline stage coupled to the output of the adder, and an output coupled to the input of the first subtractor block.

According to another embodiment, the second supply path comprises a second subtractor block having a first input coupled to receive an output of the channel memory and a second input coupled to a second output of the metrics memory.

According to another embodiment, the first and second subtractors have their first inputs coupled to the same output of the channel memory. According to another embodiment, the LDPC decoder comprises a second multiplexer having a first input coupled to the first supply path and a second input coupled to the output of the buffer, and an output coupled to an input of the adder.

According to another embodiment, the LDPC decoder comprises a control block arranged to control said buffer to selectively store certain ones of said operands from the first supply path.

According to another embodiment, the selected ones of said operands comprise operands corresponding to channel values to be updated in relation to a current layer and not in relation to a next layer of the parity check matrix.

According to another embodiment, the selected ones of said operands include at least one operand corresponding to a channel value to be updated in relation to a current layer and also to be updated in relation to a next layer of the parity check matrix.

According to another embodiment, the buffer has a size corresponding to not more than ten of said operands.

According to another embodiment, said buffer is a first-in-first-out buffer comprising a plurality of delay elements coupled in series, and selection means allowing an output of a selected one of said delay elements to be output of said FIFO buffer.

According to another embodiment, the LDPC decoder comprises a barrel shifter coupled to the output of the processor block.

According to a further aspect of the present invention, there is provided an electronic device comprising receive circuitry for providing log-likelihood ratio values relating to data symbols received from a transmission channel, and the LDPC decoder of any preceding claim arranged to store said LLR values in said channel memory.

According to yet a further aspect of the present invention, there is provided a method of performing low density parity check decoding based on a layered algorithm applied to a parity check matrix, the method comprising: storing in a channel memory channel values initially corresponding to log-likelihood ratios of symbols received via a transmission channel; storing in a metrics memory metrics values; providing operands based on said channel values and metrics values via a first supply path to: —a processor block comprising a plurality processing units in parallel and arranged to determine updated metric values based on said operands; and—to a buffer arranged to store at least one of said operands; and generating updated channel values by adding said updated metrics values from said processor block to operands from a selected one of said buffer and a second supply path.

According to an embodiment, the method comprises controlling said buffer to store selected ones of said operands corresponding to channel values to be updated in relation to a current layer and not in relation to a next layer of the parity check matrix.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which.

DETAILED DESCRIPTION

Figure 1:
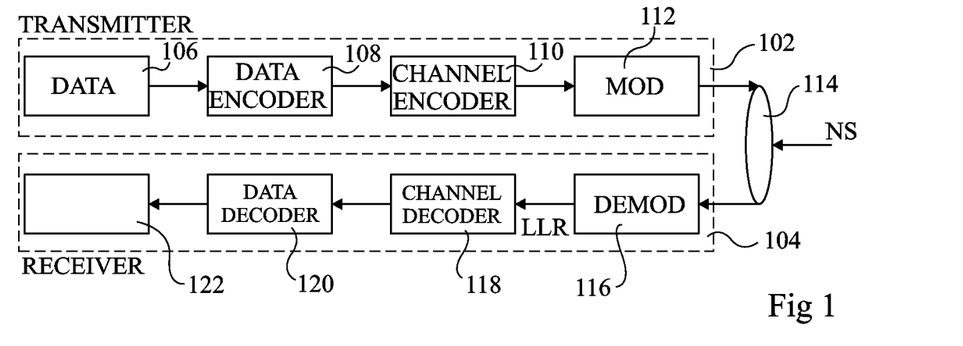
FIG. 1 illustrates a data transmission system according to an embodiment of the present invention.

FIG. 1 illustrates a data transmission system comprising a transmitter 102 and a receiver 104. The transmitter 102 comprises a data source 106, which is for example a memory or input device for receiving data to be transmitted via the transmission system. A data encoder 108 compresses the data from the data source 106 to increase the data rate, for example according to an MPEG or H264 standard. The encoded data is then provided to channel encoder 110, which performs LDPC encoding on the compressed data, and generates data symbols based on a parity check matrix H. A modulation block 112 then modulates the data symbols from the LDPC encoder such that they are suitable for transmission over a transmission channel 114.

Transmission channel 114 is, for example, a wireless channel, such as a satellite broadcasting channel, WLAN (wireless local area network) channel, terrestrial digital television channel or mobile network channel. Alternatively, the channel could be wired, such as a cable or ADSL (Asymmetric digital subscriber line) interface. Whatever the channel type, some noise NS is introduced to the modulated data signal.

The receiver 104 comprises a demodulator block 116, which receives the signal from the channel 114, and demodulates the signal to determine log-likelihood ratio (LLR) values corresponding to the received data symbols. The LLR values are provided to a channel decoder 118, which performs LDPC decoding to retrieve the originally compressed data. The compressed data is then either stored, or processed by a data decoder 120 to recuperate recover the original data, which may be provided to output circuitry 122, which is for example a memory, display or other output device. The receiver 104 is for example a set-top box for receiving a cable, terrestrial or satellite signal.

Figure 2:
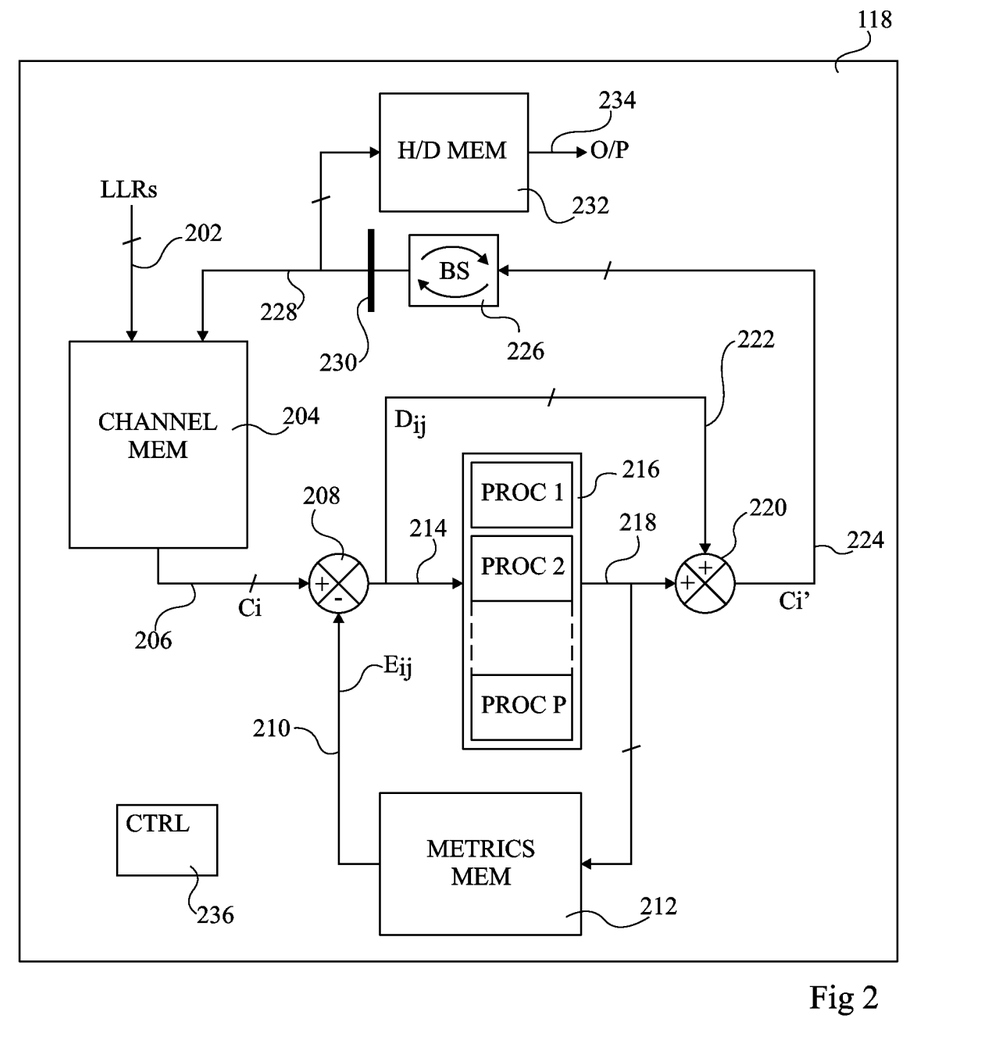
FIG. 2 illustrates an LDPC decoder.

FIG. 2 illustrates one example of the channel decoder 118 of FIG. 1. The channel decoder 118 comprises input lines 202 for receiving the log-likelihood ratios (LLR) corresponding to received symbols. For a received signal y corresponding to a transmitted data bit d with the addition of noise, the LLR of bit d with respect to signal y is defined for example as:

$$LLR(y)=LLR(d|y)=\ln(P(d=0|y)/P(d=1|y))$$

where $P(d=x|y)$ is the probability that transmitted bit d is equal to x for the given value of y.

The LLR values are for example received in blocks of R values, R corresponding to the width of the rows of the parity check matrix H. Each LLR value is for example a 6-bit signed binary value between −31 and +31, although other formats are possible.

A channel memory 204 receives the LLR values, and stores these in the form of V vectors of P values. V is for example between 2 and several hundred, and P is, for example, between 1 and several hundred and corresponds to the parallelism of the decoder. In one example according to the 802.11n standard, V is equal to 24, and P is equal to 27, 54 or 81, depending on the mode that is used. Each of the V vectors forms a channel value Ci initially stored in the memory, which is subsequently updated by successive iterations.

Output lines 206 of channel memory 204 are coupled to a subtractor block 208, for example comprising P subtractors in parallel, which subtract from channel values Ci a corresponding metrics value $E_{ij}$ received on lines 210 from a metrics memory 212. The subtractor block 208 outputs on lines 214 the resulting value $D_{ij}$, which is used as an operand for updating both the metrics and channel values. Lines 214 are coupled to a processor block 216, comprising P processors PROC1 to PROCP coupled in parallel. Processor block 216 generates modified metrics values, which are outputted on lines 218.

The modified metrics values $E_{ij}'$ are provided to the metrics memory 212 and to an adder block 220, which for example comprises P adders in parallel. The adder block 220 also receives the output operand $D_{ij}$ of subtractor block 208 on lines 222, and adds this value to the output of processor 218 to provide an output on lines 224 forming a modified channel value Ci'.

Lines 224 are coupled to a barrel shifter 226, which places the modified channel value in a suitable order for storing again in the channel memory 204. A pipeline stage 230 is, for example, provided between the barrel shifter 226 and the channel memory 204, and synchronizes the output of the modified channel value on a next cycle.

Once N iterations have been performed, each iteration corresponding to the processing of each layer once, the modified channel values indicate the hard decisions that are output to a hard decisions memory 232, from where they may be output on lines 234 as the output data values. The channel values are for example signed values, and the hard decisions are, for example, determined by the sign of each channel value, a positive sign indicating, for example, a "0" bit, and a negative sign for example indicating a "1" bit.

A control block 236 is, for example, provided for controlling the memory blocks 204, 212 and 232, as well as the processors 216, to perform the desired operations.

Operation of the decoder of FIG. 2 will now be described based on channel values and a parity check matrix shown in FIG. 3.

Figure 3:
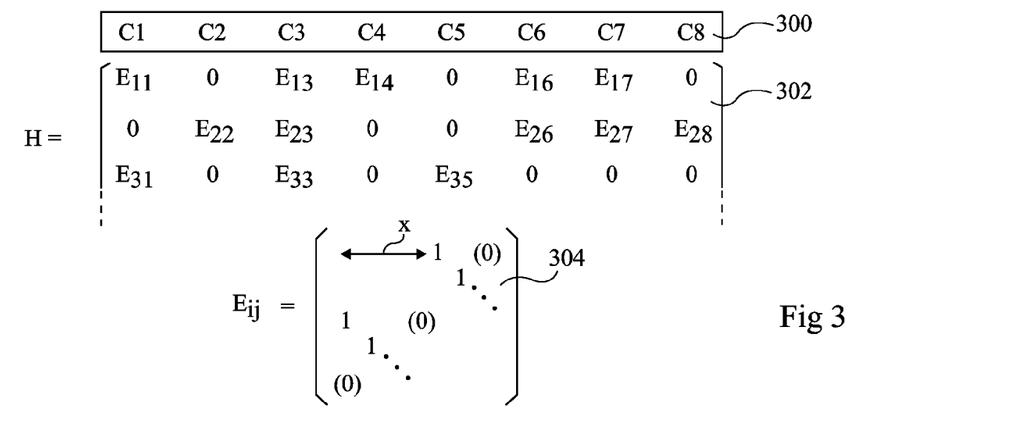
FIG. 3 illustrates an example of a parity check matrix according to an embodiment of the present invention.

FIG. 3 illustrates a block 300 of channel values C1 to C8 and a corresponding parity check matrix H 302. As described above, each channel value Ci is a vector comprising P values, which are initially set as the received LLR values. The parity check matrix 302 comprises V columns and N rows of sub-matrices. In the example of FIG. 3, V is 8, although other values are possible. Each sub-matrix is for example of P by P bits. While some parity check matrices can be entirely random, preferably, to allow for some parallelism when they are processed, a pseudo-random matrix is used. Some of the sub-matrices are null, as indicated by a "0" in FIG. 3, meaning that they comprise all zeros. Non-null sub-matrices, labelled $E_{ij}$ in matrix 302, are randomly positioned in the H matrix, and for example each comprise the identity matrix, with the diagonal 1's shifted to the right by a random value x, such that there is a single "1" bit in each column of each non-null sub-matrix.

To perform LDPC layered decoding based on the parity check matrix 302, each row of sub-matrices forms a layer, and the layers are treated in turn, starting with the first.

Firstly, a new metrics value corresponding to each non-null sub-matrix in the layer is calculated. For simplicity, these metrics values will be labelled with the same reference as the non-null sub-matrices that they correspond to. Thus, for the first layer of matrix 302, new values $E_{11}'$, $E_{13}'$, $E_{14}'$, $E_{16}'$ and $E_{17}'$ will be calculated. The new metrics values are determined for j equal to each value of the set $W_i$ as:

$$E_{ij}'=g(Ck-E_{ik}) \text{ for } k\neq j, \quad (1)$$

where Ck are channel values, g( ) is a function, k is an element of the set $W_i$ and the set $W_i$ corresponds to the set of indices of the non-null sub-matrices in the layer. Thus, for the new metrics value $E_{11}'$ in the first layer of matrix 302, $W_i$ is equal to 1, 3, 4, 6 and 7. For a given set of channel values Ci, initially, all the metrics values $E_{ij}$ are set to zero. The function g( ) according to one simple implementation could be the minimum function min( ) However, as will be apparent to those skilled in the art, there are numerous alternative functions that could be used.

Using the new metrics values $E_{ij}'$, each of the channel values corresponding to the non-null sub-matrices is then updated based on the following equation, for j equal to each value of the set $W_i$:

$$C_j'=C_j-E_{ij}+E_{ij}' \quad (2)$$

Thus, when operating on the parity check matrix 302, the circuit of FIG. 2 initially determines the updated metrics values $E_{ij}'$ for the first layer, by retrieving each of the corresponding channel values Ci from channel memory 204 and corresponding old metric values $E_{ij}$ from metrics memory 212. Loading these values for example requires one clock cycle per channel value, and thus it will take 5 cycles to load the values of the first layer. The new metrics values are then output in turn during the subsequent 5 cycles, and at the same time the corresponding channel values and metrics values are again read from channel memory 204 and metrics memory 212 and provided via path 222 so that they can be added by adder 220 to generate the new channel values. Generally, assuming that there are M non-null sub-matrices in a layer, the circuit of FIG. 2 uses 2M cycles before the next layer can be processed, which leads to a relatively low throughput.

One option for increasing the throughput of the circuit of FIG. 2 would be to add a memory to the lines 222, so that the operand values $C_k-E_{ik}$ used for determining the new metrics values according to formula (1) above can be used again for determining the corresponding updated channel values according to formula (2) above, without a further memory access. However, such a memory would need to be very large. Indeed, for some parity check matrices in which the number of non-null sub-matrices is high, the memory would need to be almost as large as the channel memory. Furthermore, if there are common channel values used in one layer and the next, such as the channel values C3, C6 and C7 used by both the first and second layers in matrix 302 of FIG. 3, these channel values can not be retrieved from channel memory 204 until they have been updated, and thus cycles will still be lost, reducing still further the overall throughput. One solution to this problem would be to avoid the reuse of the same channel values in consecutive layers by reordering the data. However, this is not possible when the parity check matrix that is used contains a high number of non-null sub-matrices in each layer.

Figure 4:
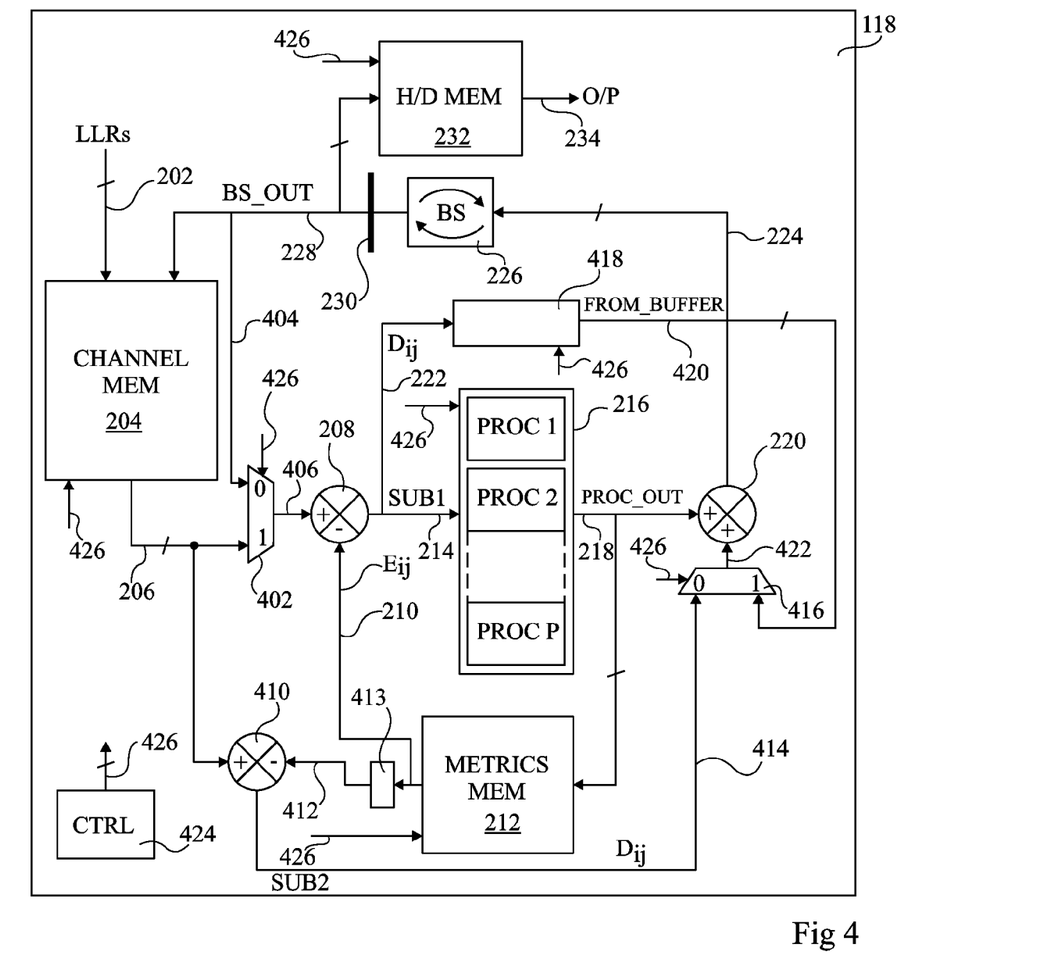
FIG. 4 illustrates an LDPC decoder according to an embodiment of the present invention.

FIG. 4 illustrates the decoder circuitry 118 according to an alternative embodiment. Elements in common with the circuit of FIG. 2 are shown with like reference numerals and will not be described again in detail. In this embodiment, the output of the channel memory on lines 206 is provided to the input of a multiplexer 402, which has a second input coupled via lines 404 to the output of the barrel shifter on line 228. The output of multiplexer 402 is provided on lines 406 to the subtractor block 208. The output of the channel memory on lines 206 is also provided to a subtractor block 410, which, for example, comprises P subtractors in parallel. Subtractor block 410 is also coupled to receive metrics values from the metrics memory 212 via lines 412, which are coupled to the output 210 of the metrics memory 212 via a buffer 413, which, for example, delays the output of the metrics memory by a number of cycles so that values read from the memory may be used for updating the channel values in the next layer. In other words, lines 210 provide metric values $E_{ij}$ for the current layer, while lines 412 provide the metric values $E_{ij}$ for the previous layer. Subtractor block 410 provides the result of the subtraction on output lines 414.

A buffer 418 is coupled to the lines 222 at the output of subtractor 208 for storing some selected operands $D_{ij}$, generated by subtractor block 208. A multiplexer 416 has an input coupled to the output of buffer 418 on lines 420, and another input coupled to the output of subtractor block 410 on lines 414. The output of multiplexer 416 on lines 422 is coupled to the adder block 220, which adds the updated metrics value from processor block 216 to either an operand from buffer 418, or an operand from subtractor block 410, based on a selection by multiplexer 416. The result of this addition is provided on lines 224 to the barrel shifter 226.

A control block 424 provides control signals on output lines 426 for controlling the channel memory 204, metrics memory 212, hard decisions memory 232, buffer 418, multiplexers 402 and 416, and processor block 216.

The buffer 418 is, for example, a FIFO (first-in-first-out) buffer, although other types of memory are possible. It is of a relatively small size, for example storing less than 10 operands, and preferably between 3 and 6, this size not being determined based on the number of non-null sub-matrices in each layer, but rather based on the number of non-null sub-matrices not reused from one layer to the next.

The lines interconnecting the various elements in FIG. 4 are for example parallel data lanes. The channel values, for example, each comprises 81 values each represented by 8 bits, and thus lines 206, 408, 214, 222, 224, 228 and 404 for example allow 81×8=648 bits to be transmitted in parallel. The metrics values for example comprise 81 values each represented by 6 bits, and thus 210 and 218 for example allow 81×6=486 bits to be transmitted in parallel. An example of operation of a circuitry of FIG. 4 for processing values based on the parity check matrix 302 of FIG. 3 will now be described with reference to the timing diagram of FIG. 5.

Figure 5:
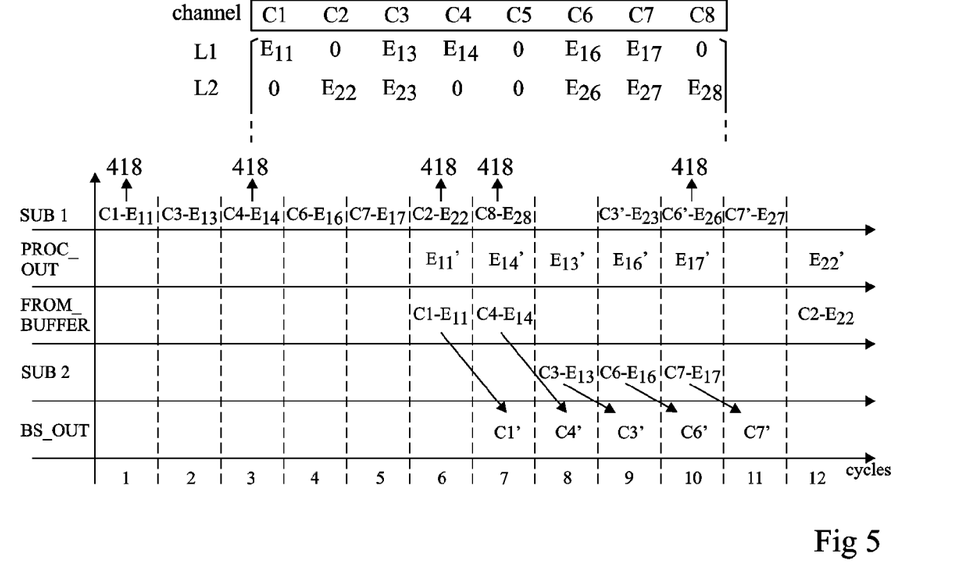
FIGS. 5 and 6 are timing diagrams illustrating operations performed during successive cycles of the decoder of FIG. 4 according to embodiments of the present invention.

FIG. 5 shows in respective rows the output operand of subtractor block 208 (SUB1), the output metrics values of processor block 216 (PROC_OUT), the output operand of buffer 418 (FROM_BUFFER), the output operand of subtractor block 410 (SUB2) and the output channel value of the pipeline stage 230 on lines 228 (BS_OUT).

In the first 5 cycles, the channel values C1, C3, C4, C6 and C7 corresponding to the non-null sub-matrices of the first layer of matrix 302 are retrieved consecutively from channel memory 204 and corresponding metrics values from metrics memory 212 are subtracted therefrom. The output of subtractor block 208 on consecutive cycles is thus $C1-E_{11}$, $C3-E_{13}$, $C4-E_{14}$, $C6-E_{16}$ and $C7-E_{17}$. The values of $C1-E_{11}$ and $C4-E_{14}$ are stored to the buffer 418 in this example.

These values are loaded into the processor block 216, and in the 6 cycle the processor block 216 outputs the first updated metrics value $E_{11}'$. This is added to the value $C1-E_{11}$ from buffer 418, and the result is the updated channel value C1', which is provided at the output of the pipeline stage 230 in the next cycle.

The channel values C2 and C8 used in the second layer L2 of the parity check matrix 302 are not updated during processing of the first layer L1, and therefore these may be retrieved from memory in cycles 6 and 7 respectively, before the other channel values have been updated. The channel value C3 however is reused in layer L2. The modified channel value C3' is output from the pipeline stage 228 in cycle 9. Multiplexer 402 is controlled to select the input corresponding to lines 404 in this cycle, such that this value C3' is immediately provided to subtractor block 208, and thus only one cycle is lost. Also in cycle 9, the channel memory 204 outputs the channel value C6 to subtractor block 410, such that this channel value can be updated.

In the example of FIG. 5, the buffer 418 is for example controlled to store all operands $D_{ij}$ output from subtractor 208 corresponding to channel values that are not reused in the next layer.

Figure 6:
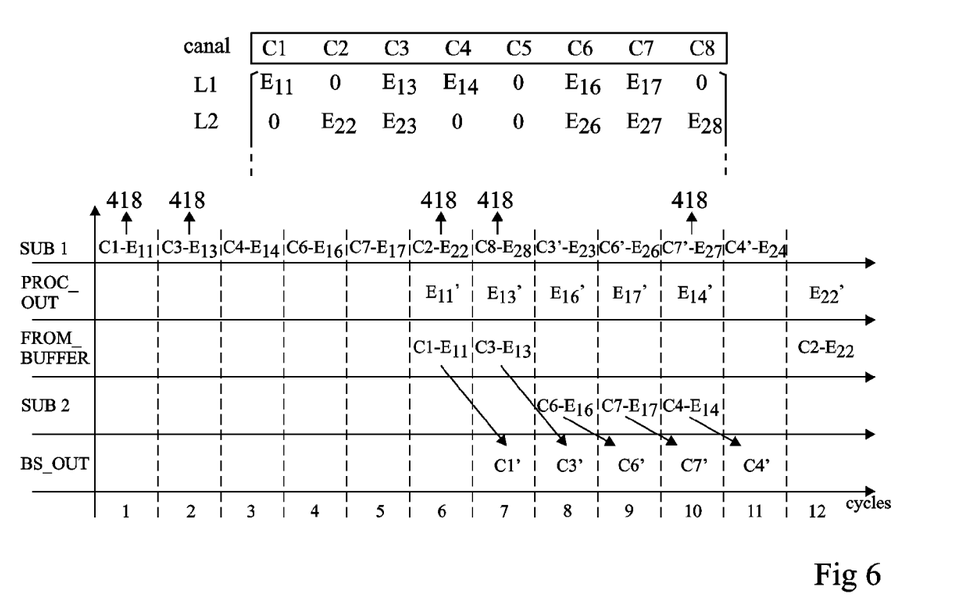

The timing diagram of FIG. 6 is similar to that of FIG. 5, but illustrates a different example of operation in which the lost cycle 8 of FIG. 5, in which no read from channel memory 204 occurs, can be avoided. In this example, where one or more channel values are needed in consecutive layers, rather than storing the last operand corresponding to a channel value not reused in the subsequent layer, a value that is reused is instead stored. Thus in the example of layer 1, the operand $C3-E_{13}$ is stored in buffer 418 rather than the operand $C4-E_{14}$. Then, in cycle 7, this value can be used with metric value $E_{13}'$ to generate the updated channel value C3' one cycle earlier than in the example of FIG. 5, thereby avoiding the lost cycle of the channel memory 204.

Figure 7:
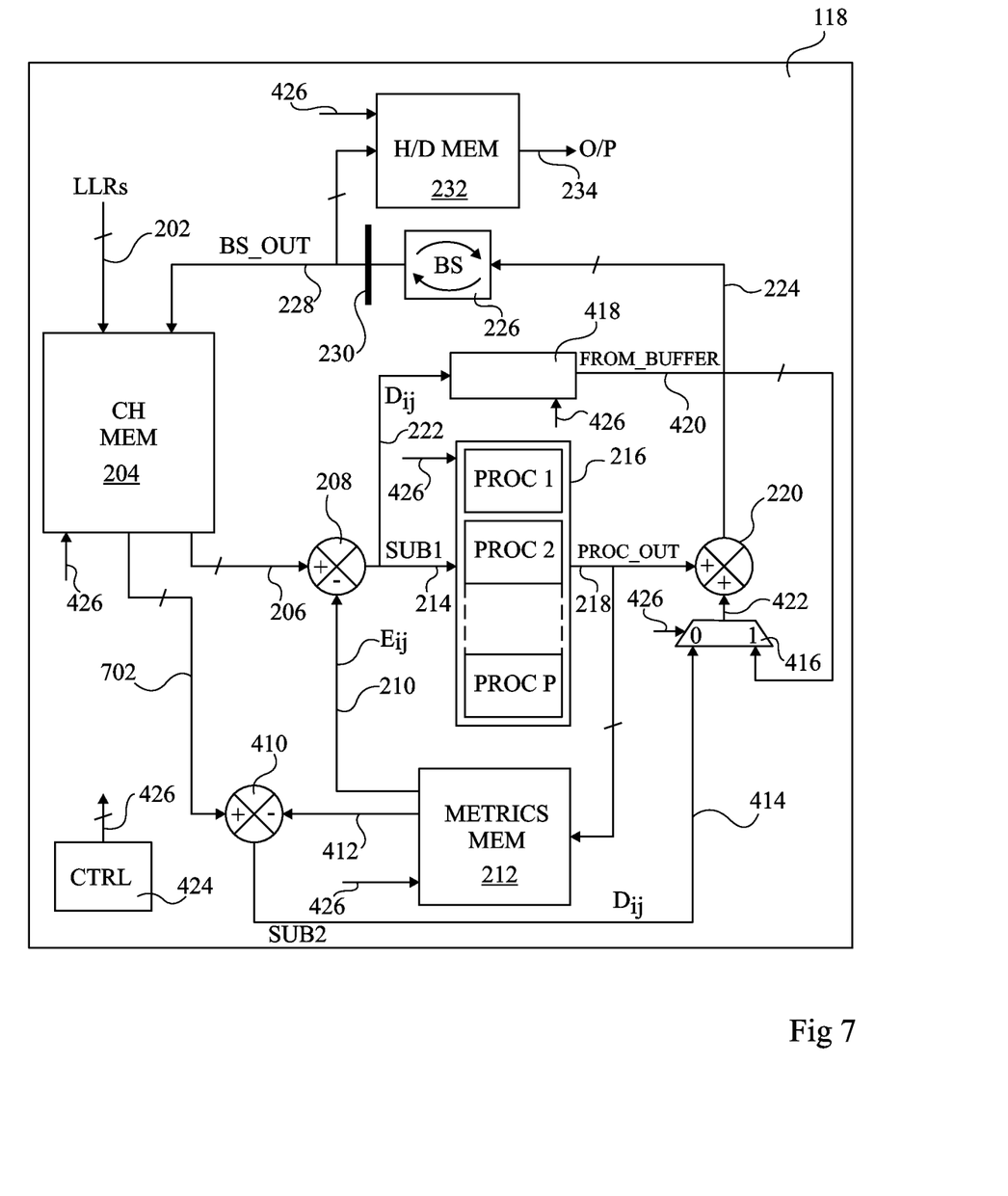
FIG. 7 illustrates an LDPC decoder according to an alternative embodiment of the present invention.

FIG. 7 illustrates an alternative embodiment of the LDPC decoder 118, which is similar to that of FIG. 4, and like features have been labelled with like reference numerals and will not be described again in detail. The LDPC decoder 118 of FIG. 7 does not comprise the bypass route 404 however, but instead the channel memory 204 is a dual port memory allowing two values to be read in a single cycle. The metrics memory 212 is also optionally a dual port memory. For example, memories 204 and 212 are triple port RAMs, one port for writing and two ports for reading. The output of channel memory 204 on lines 206 is coupled to subtractor block 208. Another output of memory 204 on lines 702 is coupled to the subtractor block 410. Similarly, the output of memory 212 on lines 210 is coupled to subtractor block 208, while another output of memory 212 on lines 412 is coupled to subtractor block 410.

Operation of the circuit of FIG. 7 is similar to that of FIG. 4, except that there is some more liberty in the memory access operations that may be performed from the memories 204 and 212. Obviously, there may be a delay of one or two cycles between the writing of a modified channel value in the channel memory 204, and the reading of this modified channel value from the channel memory 204.

Figure 8:
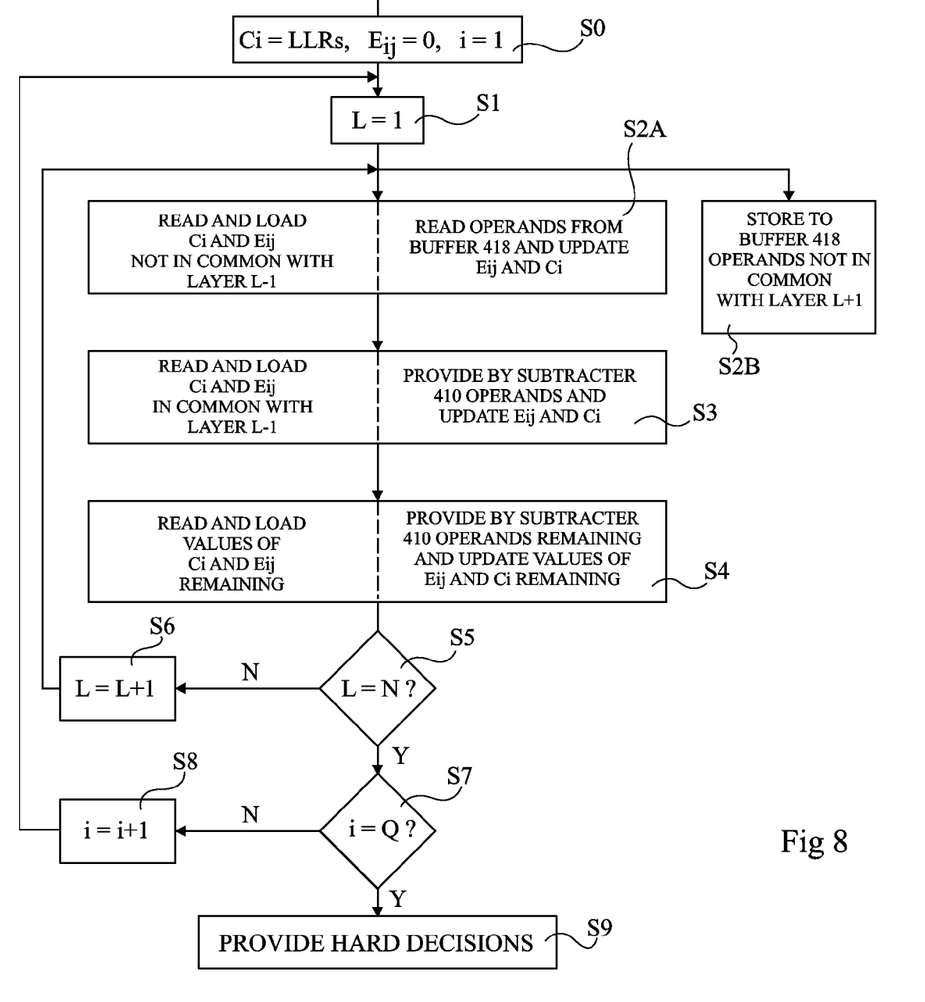
FIG. 8 is a flow diagram showing steps in a method of performing LDPC decoding according to an embodiment of the present invention.

FIG. 8 is a flow diagram illustrating steps in a method of performing LDPC decoding for a block of LLR values.

In a first step S0, the channel values Ci are set to the values of the LLRs, the metrics values are initialized to 0, and an iteration count value "i" is initialized to 1.

In the next step S1, a layer count value "L" is initialized to 1. The next steps are S2A and S2B.

In step S2A, the channel and metrics values $C_1$ and $E_{ij}$ that are not common with the previous layer L-1 are read from memory and loaded. In the first layer, there is no previous layer, and thus the channel and metrics values are for example loaded in the order they come. At the same time, updated metrics values are output by the processor block 216, and updated channel values are determined based on operands from buffer 418.

After step S2A, in step S3, channel and metrics values $C_1$ and $E_{ij}$ that are in common with the previous layer L-1 are loaded, for example directly from pipeline stage 230. At the same time, metrics values are provided by processing block 216, and corresponding operands are provided by subtractor 410 to adder 220 to provide the updated corresponding channel values.

In the next step S4, any remaining channel values and metrics values for layer L are loaded into the processing block 216. At the same time, the remaining updated metrics values continue to be output by the processing blocks 216, and the corresponding channel values are updated.

In parallel to steps S2A, S3 and S4, step S2B is performed, in which operands from subtractor block 208 that will not be reused in the subsequent layer L+1 are stored in buffer 418. However, if there are reused channel values in the layer L+1, the last value that would normally be stored is preferably replaced by the next unloaded reused value.

In the next step S5, it is determined whether L=N, where N is the total number of layers in the parity check matrix. If not, the next step is S6, in which the integer L is incremented, and then the method returns to steps S2A and S2B. If L is equal to N, the next step is S7.

In S7, it is determined whether i=Q, Q being the number of iterations to be performed before the hard decisions are output. The value of Q for example depends on the amount of noise in the channel and/or requirements of the system. For example, Q could be between 1 and several hundred.

In S7, if i is not equal to Q, the next step is S8, in which the value of i is incremented, and the method returns to step S1. If i is equal to Q, the next step is S9, in which the hard decision values based on the modified channel values are stored in the hard decisions memory 232 ready for output.

Figure 9:
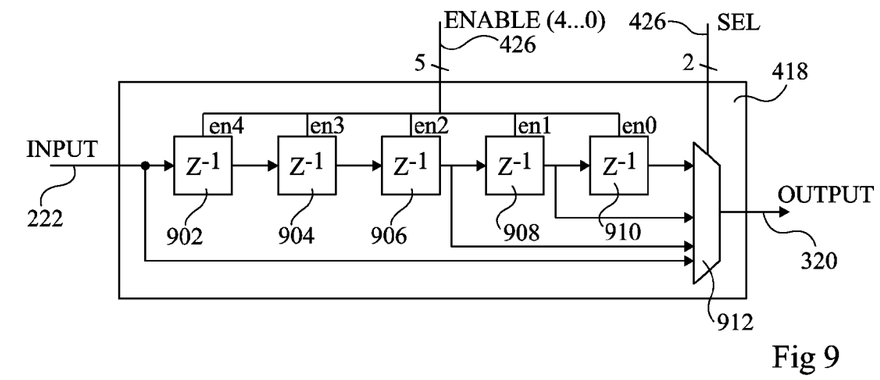
FIG. 9 illustrates a memory of FIG. 4 in more detail according to an embodiment of the present invention.

FIG. 9 shows the buffer 418 in more detail according to one embodiment in which the buffer is a FIFO comprising delay elements 902, 904, 906, 908 and 910 coupled in series between the input lines 222 and an input of a multiplexer 912. As well as the output of delay element 910, the outputs of delay elements 906 and 908 and the input 222 are, for example, also provided as separate inputs to multiplexer 912. Multiplexer 912 comprises a control input for receiving control signals on lines 426 from the control block 424. Each of the delay elements, for example, delays the operand by one cycle, and an enable signal is for example also provided on control lines 426 to each of the delay elements 902 to 910, allowing them to be individually activated, or deactivated. When activated, the operand stored by that delay element is output after one cycle. When deactivated, the operand stored by that delay element is stored until it is activated again.

The structure of FIFO 418 allows a total of 5 operands to be stored, each with a variable delay or no delay, and some adjustment in the order of the operands. It will be apparent to those skilled in the art that the number of delay elements and the extent to which the number of cycles of delay can be adjusted can be chosen based on requirements, for example depending on the characteristics of the parity check matrix.

An advantage of the LDPC decoder of FIGS. 4 and 7 is that, due to there being two supply paths via which operands may be provided to the adder block 220, the buffer 418 can be relatively small in size. One supply path is provided via subtractor block 208 and the buffer 418, and another via subtractor 410. Furthermore, performance is greatly increased, as while new values for a next layer are loaded and stored in the processor block 216 and buffer 418, the operands for updating the channel values of the present layer may be provided by the subtractor block 410.

Furthermore, by providing a bypass route 404 for the channel values determined in a previous layer, not only is the updated value available for example two cycles earlier than if it were first stored in the channel memory 204, but an access to the channel memory 204 is not required in that cycle, leaving the channel memory 204 free to provide a value to the subtractor block 410.

Having thus described at least one illustrative embodiment of the invention, various alterations, modifications and improvements will readily occur to those skilled in the art.

For example, it will be apparent to those in the art that the circuitry of FIG. 4 is one example, and that alterations can be made. For example, while the barrel shifter 226 is positioned at the output of adder 220, it could be positioned elsewhere, such as at the output of the channel memory 204. Furthermore, while the buffer 418 stores the operand resulting from the subtraction of a metric value from a channel value, alternatively it could store this pair of operands, and a further subtractor block could be provided to perform the subtraction after the buffer 418. Furthermore, the pipeline stage 230 could be positioned elsewhere, such as at the input to the barrel shifter 226, and one or more additional pipeline stages could be provided.

Furthermore, it will be apparent to those skilled in the art that various algorithms for updating the metrics values as performed by processor block 216 could be used while maintaining the same advantages.

What is claimed is:

1. A low density parity check decoder for performing LDPC decoding based on a layered algorithm applied to a parity check matrix, the decoder comprising:
a channel memory arranged to store channel values initially corresponding to log-likelihood ratios of symbols received via a transmission channel;
a metrics memory arranged to store metrics values;
first and second operand supply paths each arranged to provide operands based on the channel values and the metrics values;
a processor block comprising a plurality of processing units in parallel and arranged to receive operands from said first operand supply path and to determine updated metric values based on said operands;
a buffer arranged to store at least one of said operands from said first operand supply path;
an adder coupled to an output of the processor block and arranged to generate updated channel values by adding said updated metrics values to operands from a selected one of said buffer and said second operand supply path; and
a first multiplexer having a first input coupled to the second operand supply path and a second input coupled to an output of the buffer, and an output coupled to an input of the adder.

2. The LDPC decoder of claim 1, wherein the first supply path comprises a first subtractor block having a first input coupled to a selected one of the channel memory and the output of the adder and a second input coupled to a first output of the metrics memory.

3. The LDPC decoder of claim 2, wherein the first supply path comprises a second multiplexer having a first input coupled to an output of the channel memory and a second input coupled to the output of a pipeline stage coupled to the output of the adder, and an output coupled to the input of the first subtractor block.

4. The LDPC decoder of claim 2, wherein:
the second supply path comprises a second subtractor block having a first input coupled to receive an output of the channel memory and a second input coupled to a second output of the metrics memory; and
the first and second subtractors have their first inputs coupled to the same output of the channel memory.

5. The LDPC decoder of claim 1, wherein the second supply path comprises a second subtractor block having a first input coupled to receive an output of the channel memory and a second input coupled to a second output of the metrics memory.

6. The LDPC decoder of claim 1, comprising a control block arranged to control said buffer to store selected ones of said operands from the first supply path.

7. The LDPC decoder of claim 6, wherein the selected ones of said operands comprise operands corresponding to channel values to be updated in relation to a current layer and not in relation to a next layer of the parity check matrix.

8. The LDPC decoder of claim 6, wherein the selected ones of said operands include at least one operand corresponding to a channel value to be updated in relation to a current layer and also to be updated in relation to a next layer of the parity check matrix.

9. The LDPC decoder of claim 1, wherein the buffer has a size corresponding to not more than ten of said operands.

10. The LDPC decoder of claim 1, wherein said buffer is a first-in-first-out buffer comprising a plurality of delay elements coupled in series, and selection means allowing an output of a selected one of said delay elements to be output of said FIFO buffer.

11. The LDPC decoder of claim 1, further comprising a barrel shifter coupled to the output of the processor block.

12. An electronic device comprising receive circuitry for providing log-likelihood ratio values relating to data symbols received from a transmission channel, and the LDPC decoder of claim 1 arranged to store said LLR values in said channel memory.

13. A low density parity check decoder for performing decoding based on a layered algorithm applied to a parity check matrix, comprising:
- a channel memory configured to store channel values initially based on log-likelihood ratios of symbols received on a transmission channel;
- a metrics memory configured to store metrics values;
- a first supply circuit configured to generate first operands based on the channel values and the metrics values;
- a processor block configured to receive the first operands and to determine updated metrics values based on the first operands;
- a buffer configured to store at least one of the first operands;
- a second supply circuit configured to generate second operands based on the channel values and the metrics values; and
- an adder configured to generate updated channel values by adding the updated metrics values to operands selected from the buffer and the second supply circuit, wherein the first supply circuit comprises a first multiplexer having a first input coupled to an output of the channel memory and a second input configured to receive updated channel values from the adder, and a first subtractor having a first input coupled to an output of the first multiplexer and a second input coupled to the metrics memory.

14. A low density parity check decoder as defined in claim 13, wherein the processor block comprises a plurality of processing units.

15. A low density parity check decoder as defined in claim 13, wherein the second supply circuit comprises a second subtractor block having a first input coupled to an output of the channel memory and a second input configured to receive metrics values from the metrics memory.

16. A low density parity check decoder as defined in claim 15, further comprising a second buffer coupled between the second input of the second subtractor and the metrics memory.

17. A low density parity check decoder as defined in claim 13, further comprising a second multiplexer having a first input coupled to an output of the second supply circuit, a second input coupled to an output of the buffer, and an output coupled to an input of the adder.

18. A low density parity check decoder as defined in claim 13, further comprising a control block configured to control the buffer to store selected ones of the first operands.

19. A low density parity check decoder as defined in claim 18, wherein the selected ones of the first operands comprise operands corresponding to channel values to be updated in relation to a current layer and not in relation to a next layer of the parity check matrix.

20. A low density parity check decoder as defined in claim 18, wherein the selected ones of the first operands include at least one operand corresponding to a channel value to be updated in relation to a current layer and also be updated in relation to a next layer of the parity check matrix.

21. A low density parity check decoder as defined in claim 13, wherein the buffer comprises a first-in-first-out buffer including a plurality of delay elements coupled in series and a selector configured to output a selected one of the delay elements as an output of the first-in-first-out buffer.

22. A low density parity check decoder as defined in claim 13, further comprising a barrel shifter and a pipeline stage coupled between the adder and the channel memory.

* * * * *